United States Patent [19]

Park

[11] Patent Number: 4,861,087
[45] Date of Patent: Aug. 29, 1989

[54] OFFSET MECHANICAL GRIPPER

[75] Inventor: Joon Park, Glendale, Calif.

[73] Assignee: Hughes Aircraft Company, Los Angeles, Calif.

[21] Appl. No.: 215,179

[22] Filed: Jul. 5, 1988

[51] Int. Cl.$^4$ ............................................. B66C 1/62
[52] U.S. Cl. .................................... 294/119.1; 294/88; 294/86.4; 294/907; 901/33; 901/37; 29/741
[58] Field of Search .................. 294/119.1, 106, 81.61, 294/86.4, 88, 907; 29/741, 759; 901/31–33, 37, 39; 414/736

[56] References Cited

U.S. PATENT DOCUMENTS

| | | | |
|---|---|---|---|
| 4,177,549 | 12/1979 | Mori et al. | 29/741 X |
| 4,179,803 | 12/1979 | Wolkert | 29/741 |
| 4,240,660 | 12/1980 | Roth et al. | 294/81.61 X |
| 4,243,257 | 1/1981 | Shackleford | 901/37 X |
| 4,482,289 | 11/1984 | Inaba et al. | 414/736 X |

Primary Examiner—Robert B. Reeves
Assistant Examiner—Dean J. Kramer
Attorney, Agent, or Firm—Leonard A. Alkov

[57] ABSTRACT

The offset mechanical gripper is for mounting on a robot for grasping an electrical component. Two pairs of fingers are offset on L-shaped arms. The fingers in a pickup pair move toward and away from a fixed pickup plane to always hold grasped components centered on the plane. The first pair of arms is mounted on a first carriage and the second pair of arms is mounted on a second carriage so that spacing between the carriages controls spacing between the pairs of fingers. The pairs of fingers are each operated by a fluid cylinder, with adjustment of travel and sensing of non-grasp.

26 Claims, 3 Drawing Sheets

OFFSET MECHANICAL GRIPPER

FIELD OF THE INVENTION

This invention is directed to a device for grasping an electrical component with axial wire leads thereon by grasping the leads and holding the component offset to one side of the body of the positioning device. The device can be adjusted to pick up components of various lengths and with leads of various sizes.

BACKGROUND OF THE INVENTION

Assembly requires the placement of one part upon another. In the past, this has been manually accomplished, particularly in those cases where small parts of different sizes and shapes were to be placed upon different locations on a larger support. Automated assembly technology originated in the grasp and placement of the same size part in the same location, and then proceeded to grasp and placement of the same size part in different locations. This type of assembly is particularly noticed on a printed wiring board where complex wiring interconnections can be provided by etched conductive paths on a dielectric board. Components are grasped, picked up, and placed in position on the printed wiring board and are secured thereon. In handling such components, most of the prior art developments have been in the category of dedicated tooling, where the tooling is designed to perform one function or handle components of a single size. Such dedicated tooling is expensive, if it can only be used in such a limited manner. In addition, such dedicated tooling does not have the adaptability that it can handle components of different sizes in the same series of assembly operations. Therefore, such assembly equipment is of limited scope and value. Thus, there is need for assembly devices which have a broad scale of utility and which can grasp and hold parts of different sizes.

SUMMARY OF THE INVENTION

In order to aid in the understanding of this invention, it can be stated in essentially summary form that it is directed to a mechanical gripping device which has a body and which has first and second pairs of fingers with adjustment means to adjust the distance between the pairs of fingers. The fingers are offset to the side of the body. The fingers can engage component leads of different sizes and hold them on a known center plane.

It is thus a purpose and advantage of this invention to provide a mechanical gripping device which has a wide range of manufacturing capability by providing the capability of grasping and handling a multiplicity of parts of different size without incurring machine down time to change tooling.

It is another purpose and advantage of this invention to provide more production time by eliminating off-line size adjustment of the positioning device.

It is another purpose and advantage of this invention to provide a mechanical gripper device which is capable of handling a variety of component sizes without interrupting production, which might otherwise be required in order to change positioning tooling.

It is a further purpose and advantage of this invention to provide an electronic part gripping device which can be attached to the arm of a robot which is capable of multiple axis motion and positioning so as to position parts as located on the X-, Y- and Z-axes.

It is a further purpose and advantage of this invention to provide an electronic component gripping device which has fingers offset from the body of the gripping device so that the body of the gripping device does not interfere with access to the component so that it may be retained by the fingers of the gripping device as it is held in place. This permits approach to the component for other purposes, such as the application of heater bars for reflow soldering the component in place.

Other purposes and advantages of this invention will become apparent from a study of the following portion of this specification, the claims and the attached drawings.

DESCRIPTION OF THE PREFERRED EMBODIMENT

Figure 1:
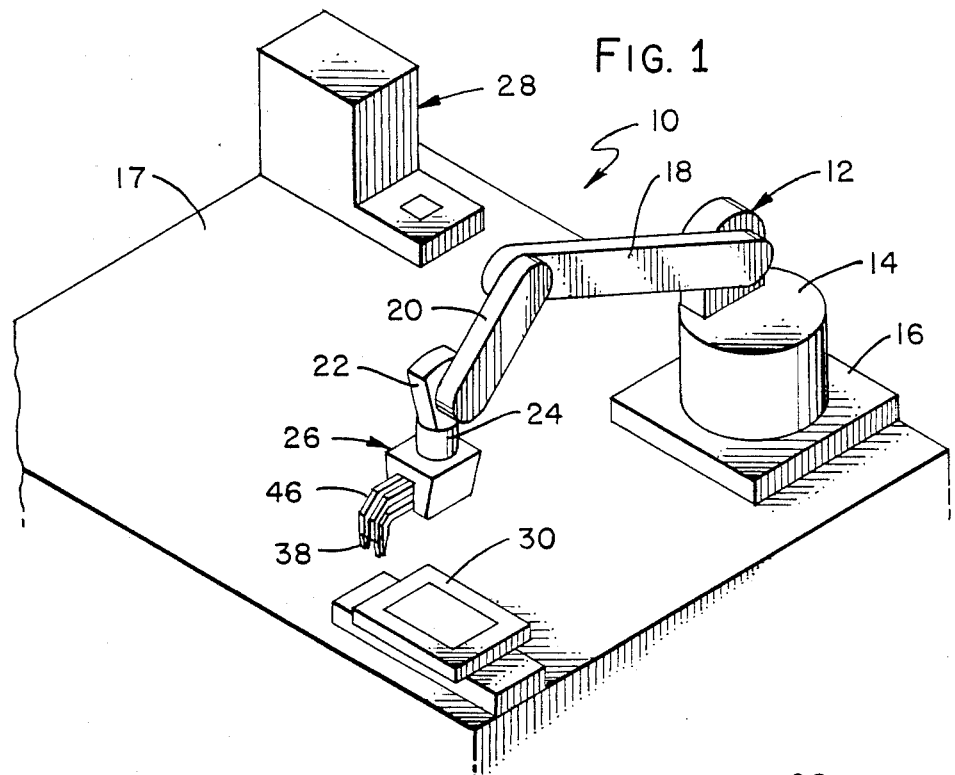
FIG. 1 is an isometric view of an assembly system which incorporates the offset mechanical gripping device of this invention.

In FIG. 1, an assembly station is generally indicated at 10. The assembly station has a programmable positioning device which may be called a robot. The robot device is generally indicated at 12. The robot has a stand 14 which is rotatable upon a vertical axis on its base 16, which is in turn secured on the table 17 of the assembly station 10. Stand 14 has arms 18, 20 and 22 successively pivoted to each other. Arm 22 has mounting plate 24 on its end. The face of the mounting plate 24 is the face upon which the offset mechanical gripper device 26 of this invention is mounted. It can be seen that the robot can position the gripper device anywhere in X, Y and Z coordinates, using the top of the assembly station as a reference. Each of the arm pivots and rotational pivots is powered and feedback signaling of position is available so that the mounting plate can be moved into any desired position. For automated assembly, these position signals are provided by computer control.

Dispensing station 28 is positioned on the assembly station. The dispensing station dispenses electronic components which can be grasped and picked up by the offset mechanical gripper device 26 and moved to a selected position. The components dispensed at station 28, for example, are cylindrical electrical components with an electric wire lead extending from each end thereof. The leads are bent in zee shape so that the leads can lie against a surface while the larger diameter of the body of the electrical component lies against or is spaced from the surface. It is to be noted that such electrical components have different lengths and different wire lead diameters.

Printed wiring board 30 is the location on which the electrical components will be placed, with the leads against the printed wiring board for soldering at a particular location with respect thereto. Thus, electrical components are picked up by the gripper device 26 at the dispensing station 28 and these electrical devices are carried to the printed wiring board 30 and held thereon while they are attached thereto. Attachment may be by reflow soldering when solder heater bars are clamped onto the leads where they lie against the printed wiring board.

Figure 2:
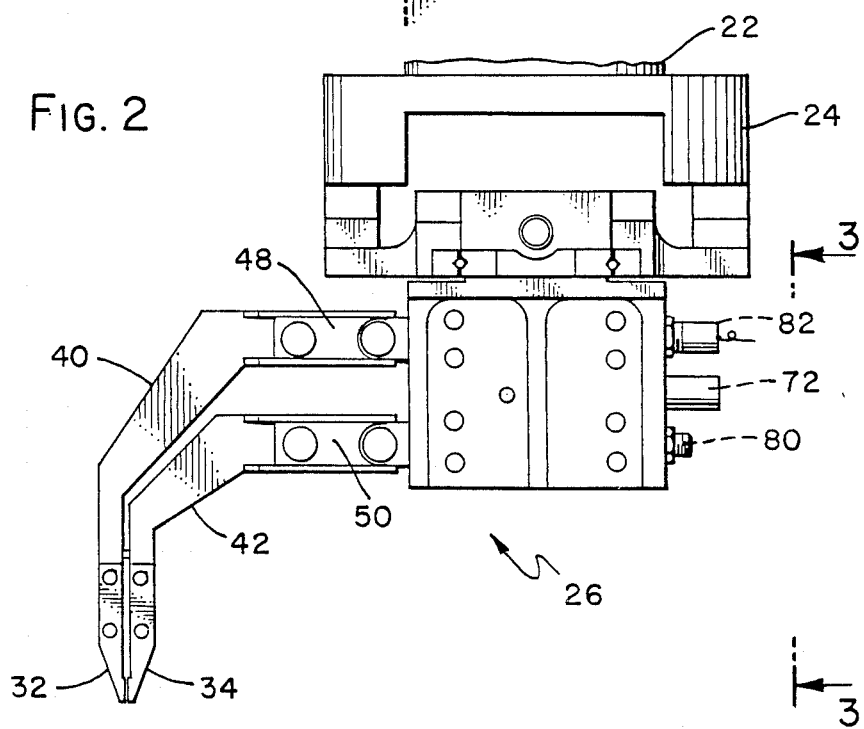
FIG. 2 is a left side elevational view of the offset mechanical gripping device of this invention, when the fingers are considered to be on the front.
Figure 3:
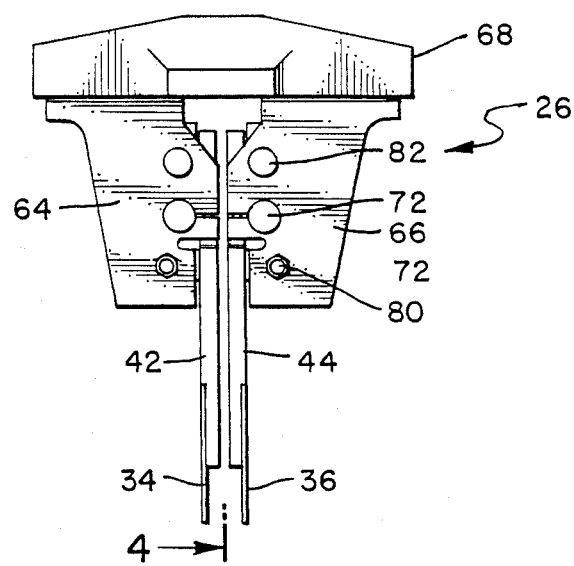
FIG. 3 is a rear elevational view thereof, as seen generally along the line 3—3 of FIG. 2.
Figure 4:
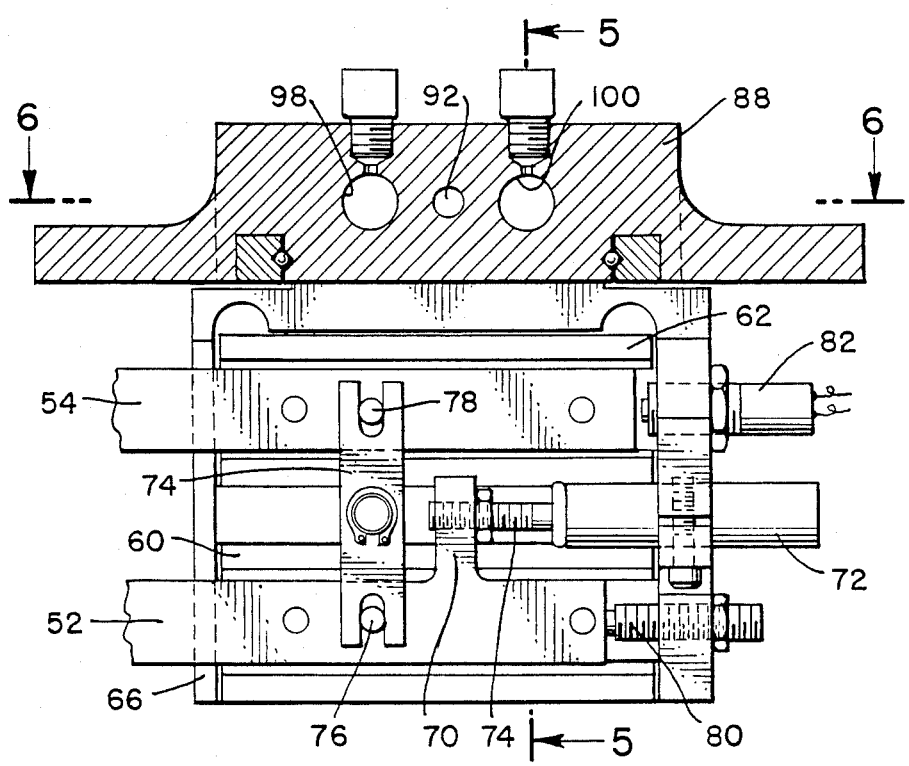
FIG. 4 is an enlarged substantially central section through the gripping device, looking to the right, as seen generally along the line 4—4 of FIG. 3.
Figure 5:
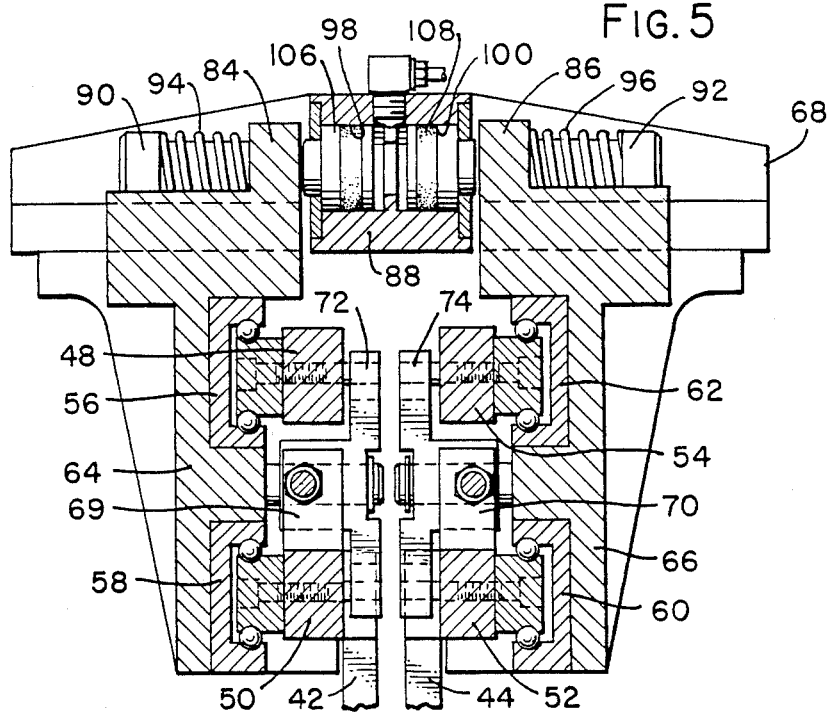
FIG. 5 is a vertical section through the body of the gripping device, looking toward the front, as seen generally along the line 5—5 of FIG. 4.

It is significant to the structure that the fingers of the gripper device are offset to the side of the gripper device so that there is little obstruction to the component being positioned. There are four fingers in two pairs. The left pair of fingers is indicated in FIG. 2 at 32 and 34. In FIG. 3, the left rear finger 34 and right rear finger 36 of the two pairs are shown, and FIG. 1 shows the right front finger 38 which is not shown in detail in the other figures. Fingers 36 and 38 form the right pair of fingers. The left and right pairs of fingers are respectively mounted on arms 40, 42, 44 and 46. It is significant that these arms are L-shaped so that the body of the gripper device is not directly above the fingers. The L-shaped nature is shown in FIG. 2. The arms are respectively mounted on arm actuators 48, 50, 52 and 54. As is best seen in FIG. 5, these arm actuators are mounted on linear ball slides. The ball slides have moving members bolted to the arm actuators and U-shaped fixed members 56, 58, 60 and 62, respectively, see FIG. 5. The arms and arm actuators for a particular pair of fingers are positioned above and below each other, as seen in FIGS. 4 and 5. The pair of fixed parts of the ball slide associated with left arms 48 and 50 are mounted in left carriage 64, while the ball slide portions 60 and 62 associated with the right arms are mounted in right carriage 66, see FIG. 5. Both of these carriages are mounted on body 68.

The two lower arm actuators 50 and 52 respectively have bosses 69 and 70 mounted thereon. The structure is best seen in FIG. 4, where there is a side elevational view of the arm actuator 52. Motor 72 is preferably a fluid motor, such as an air or hydraulic cylinder. The cylinder has a piston rod 74 which is attached to boss 70. In this way, the arm actuator 52 can move back and forth in its carriage 66. The inactivated position is shown in FIG. 4. In order to oppositely move the companion arm actuator 54, lever 74 is pivoted on the carriage and has a fork at each end. These forks respectively embrace pin 76 on arm actuator 52 and pin 78 on arm actuator 54. In this way, when the lower arm 52 moves to the right to open the fingers, the upper arm 54 is moved to the left. The pickup fingers always move toward and away from a central reference grasp plane so that grasped components always have their centerline on that plane. The amount of opening is limited by adjustable stop screw 80. When the fingers are closed all the way without grasping a component, the upper arm actuator 54 moves to the right to actuate switch 82. The switch is actuated with complete closure of the fingers 36 and 38, but when they grasp a component lead, the switch is not actuated. In this way, a signal is emitted which indicates whether or not a component lead is grasped. A similar structure is provided on the other carriage 64 to operate the other pair of fingers.

Figure 6:
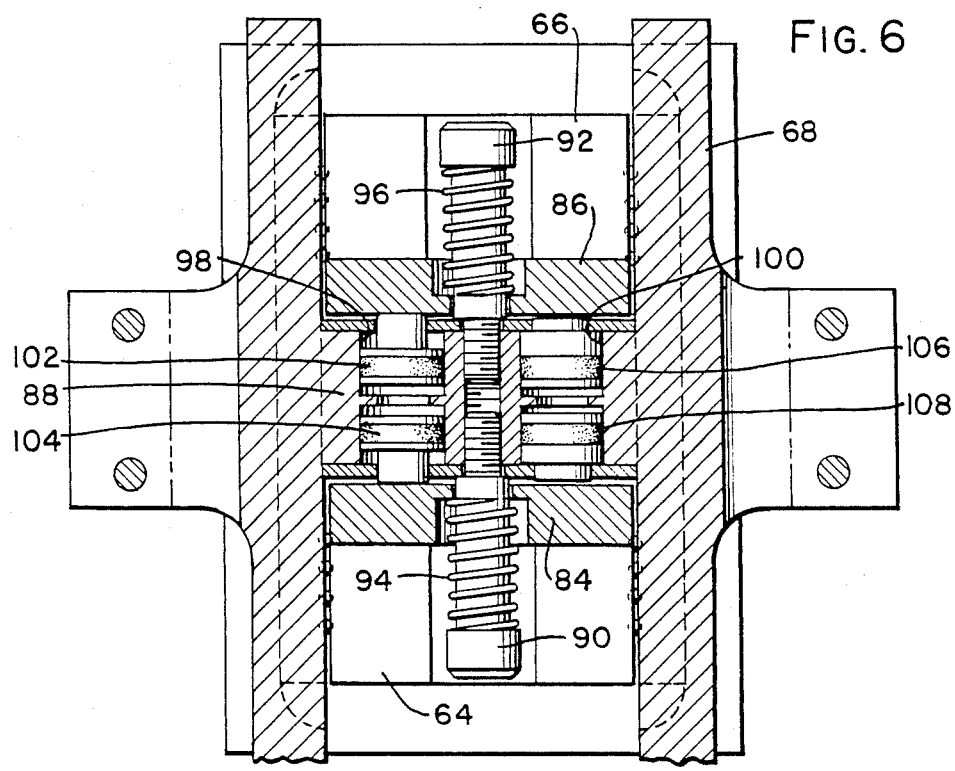
FIG. 6 is a downwardly looking section, as seen generally along the line 6—6 of FIG. 4. therewith.

The carriages 64 and 66 are mounted on ball slides to move towards and away from each other. The ball slides are indicated by balls at the left and right edges of the carriages in FIG. 6. The carriages 64 and 66 have upstanding ears 84 and 86 which lie on opposite sides of crossbar 88 on body 68. Shoulder bolts 90 and 92 pass through openings in the ears and engage in the crossbar 88. Compression springs 94 and 96 urge the ears towards each other so that the fingers have a minimum spacing therebetween. In order to adjust the spacing, one or more spacer cylinder bores are provided in the crossbar 88. Bores 98 and 100 are shown. Pairs of pistons are provided in each of the bores with pistons 102 and 104 provided in bore 98 and pistons 106 and 108 provided in the bore 100. As is best seen in FIG. 6, the piston rods are longer on pistons 102 and 104 than they are on pistons 106 and 108. Thus, when fluid under pressure is introduced between pistons 106 and 108, they thrust the ears 84 and 86 apart a small distance larger than the minimum distance to increase the spacing between the pairs of fingers. FIG. 6 shows this condition. When the fluid under pressure is introduced between pistons 102 and 104, the ears 84 and 86 are spaced a greater amount, by virtue of their longer piston rods to provide greater and known spacing between the fingers. In this way, three different finger spacings can be achieved by applying pressure or not applying pressure between the pairs of pistons. By this construction, the adjustment of finger spacing can be made without down time, but as a part of computer controlled successive component placement.

The gripper device of this invention becomes part of a system wherein axial lead electrical components and other similar components can be grasped, picked up and positioned. The gripper device is capable of being adjusted to three different spacing dimensions between the pairs of fingers for gripping components of different lengths. The axial leads on such components may vary somewhat in diameter, and the finger-operating mechanism of the gripper device centers the leads between the fingers to apply equal finger force on each side of the lead, with the lead positioned on the center line therebetween. In this way, the lead is always exactly positioned on the center line, even with slight changes in lead diameter. The gripping action of the two pairs of finger is simultaneous when the two finger-operating cylinders are simultaneously actuated. When picked up in this manner, the component is accessible from top and bottom and thus can be taken to a component inspection station to optically or otherwise determine the nature and value of the component. This offset arm arrangement also permits direct downward access by reflow solder heater bars when the positioning device has placed the component upon the printed wiring board at its desired location. A minimum of interference with access to the component is achieved by employing the offset arms.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:
1. A gripper device comprising:
 a body
 at least one movable carriage on said body, said body being mountable upon a robot for positioning said body upon X, Y and Z orthogonal axes, said carriage being movable on said body in a direction parallel to said X axis;

first and second arm actuators movably mounted on said carriage for movement substantially on said Y-axis, a motor to move said first arm actuator with respect to said carriage, interconnection means between said first and second arm actuators so that said second arm actuator moves substantially parallel to said first arm actuator in the opposite direction therefrom upon movement of said first arm actuator;

third and fourth arm actuators mounted on said body for movement on said Y-axis, said third arm actuator having a motor connected thereto for motion of said third arm actuator along said Y-axis and means interconnecting said fourth arm actuator with said third arm actuator for motion of said fourth arm actuator on said Y-axis in a direction opposite to said third arm actuator; and first, second, third and fourth L-shaped arms respectively mounted on said first, second, third and fourth arm actuators and first, second, third and fourth component grasping fingers respectively on said first, second, third and fourth arms, said fingers being directed generally in a direction parallel to said Z-axis away from said body so that motion of said carriage on said body changes the spacing between said first and second fingers and said third and fourth fingers and motion of said motor opens and closes said first finger with respect to said second finger and said third finger with respect to said fourth finger for component grasp and positioning.

2. The gripper device of claim 1 wherein said third and fourth arm actuators are mounted on a second carriage, said second carriage also being movable along said X-axis to adjust the spacing between said pairs of fingers.

3. The gripper device of claim 2 wherein said carriages are spring-urged towards each other and there is a spacing means therebetween for determining the spacing between said carriages to determine the spacing between said pairs of fingers.

4. The gripper device of claim 3 wherein said spacing means comprises at least one cylinder which can be extended by fluid pressure to increase the spacing between said first and third fingers.

5. The gripper device of claim 1 wherein at least one cylinder is connected to said movable carriage and the piston in said cylinder can be extended by fluid pressure to increase the spacing between said first and third fingers.

6. The gripper device of claim 1 wherein said interconnection means between said first arm actuator and said second arm actuator comprises a lever pivoted on said carriage, said lever engaging both said first arm actuator and said second arm actuator, so that said second arm actuator is driven by movement of said first arm actuator.

7. The gripper device of claim 6 wherein there is a second carriage and said third and fourth arm actuators are movably mounted on said second carriage and there is a cylinder with a piston therein for positioning said second carriage with respect to said body.

8. The gripper device of claim 7 wherein said piston for positioning said first carriage is in the same bore as said piston for positioning said second carriage.

9. A positioning system for positioning an electrical component;

said positioning system having a gripper device, said gripper device having a body for attachment to a positioning robot, said body having X, Y and Z orthogonal axes;

first and second carriages movably mounted on said body on said X-axis;

first and second arm actuators, comprising a first pair of arm actuators, movably mounted on said first carriage on said Y-axis, means connected to both said first and second arm actuators for moving said first and second arm actuators on said Y-axis in opposite directions with respect to each other;

first and second arms respectively attached to said first and second arm actuators, said first and second arms being L-shaped, first and second fingers respectively on said first and second arms so that said first and second fingers comprise a first pair of fingers, said first and second fingers being directed generally along said Z-axis;

third and fourth arm actuators movably mounted on said second carriage on said Y-axis so that said third and fourth arm actuators comprise a second pair of arm actuators;

means interconnecting said third and fourth arm actuators so that when one of said arm actuators moves in a first direction, the other thereof moves in the opposite direction;

third and fourth arms respectively attached to said third and fourth arm actuators, said arms being L-shaped;

third and fourth fingers respectively attached to said third and fourth arms, said third and fourth fingers being generally directed along said Z-axis and comprising a second pair of fingers so that spacing between said carriages controls spacing between said pairs of fingers and said means for moving said arm actuators is means for opening and closing said fingers in each pair of fingers.

10. The positioning system of claim 9 wherein a motor is connected to one of said first and second arm actuators and a motor is connected to one of said third and fourth arm actuators and there is means interconnecting said first arm actuator with said second arm actuator and there is means for interconnecting said third arm actuator with said fourth arm actuator so that actuation of said motors opens and closes said fingers.

11. The positioning system of claim 10 wherein said means interconnecting said first arm actuator with said second arm actuator comprises a first lever pivotally mounted on said first carriage, said first lever engaging both said first and second arm actuators so motion of said first arm actuator moves said second arm actuator in the opposite direction.

12. The positioning system of claim 11 wherein said means interconnecting said third arm actuator with said fourth arm actuator comprises a second lever pivotally mounted on said second carriage, said second lever being engaged with both said third arm actuator and said fourth arm actuator so that when said third arm actuator is moved in one direction along said Y-axis, said fourth arm actuator is moved in the opposite direction along said Y-axis.

13. The positioning system of claim 12 wherein said means for moving said first arm actuator is a first fluid piston and said means for moving said third arm actuator is a second fluid piston and there is a first adjustable stop mounted on said first carriage for limiting the motion of said first arm actuator with respect to said carriage and there is a second adjustable stop mounted on said second carriage for limiting the motion of said third arm actuator with respect to said second carriage.

14. The positioning system of claim 13 wherein there is a first sensor mounted on said first carriage for sensing when said first pair of fingers is fully closed to indicate non-grasp of a component and there is a second sensor mounted on said second carriage to be actuated by one of said arm actuators on said second carriage for signaling closing of said second pair of fingers to indicate non-grasp of a part by said second pair of fingers.

15. The positioning system of claim 9 wherein a portion of said body extends between said carriages to form a crossbar and there are adjustable stops positioned on said crossbar to control the distance between said carriages to control the distance between said pairs of fingers.

16. The positioning system of claim 15 wherein said adjustable stops comprise a pair of pistons in a common bore and fluid connection means between said pistons so that separation of said pistons by introduction of fluid under pressure between said pistons maintains a larger spacing between said carriages to maintain a larger spacing between said pairs of fingers.

17. The positioning system of claim 15 further including springs urging said carriages towards each other so that said adjustable spacing means acts against said springs.

18. The positioning system of claim 16 further including springs urging said carriages towards each other so that said adjustable spacing means acts against said springs.

19. The positioning system of claim 18 wherein there are two bores on said crossbar and there are two pairs of pistons in each of said bores, one of said pairs of pistons being longer than the other of said pairs of pistons so that separation of one of said pairs of pistons causes greater separation between said carriages than separation of the other pair of said pistons.

20. The positioning system of claim 19 wherein a motor is connected to one of said first and second arm actuators and a motor is connected to one of said third and fourth arm actuators and there is means interconnecting said first arm actuator with said second arm actuator and there is means for interconnecting said third arm actuator with said fourth arm actuator so that actuation of said motors opens and closes said fingers.

21. The positioning system of claim 20 wherein said means interconnecting said first arm actuator with said second arm actuator comprises a first lever pivotally mounted on said first carriage, said first lever engaging both said first and second arm actuators so motion of said first arm actuator moves said second arm actuator in the opposite direction.

22. The positioning system of claim 21 wherein said means interconnecting said third arm actuator with said fourth arm actuator comprises a second lever pivotally mounted on said second carriage, said second lever being engaged with both said third arm actuator and said fourth arm actuator so that when said third arm actuator is moved in one direction along said Y-axis, said fourth arm actuator is moved in the opposite direction along said Y-axis.

23. The positioning system of claim 22 wherein said means for moving said first arm actuator is a first fluid piston and said means for moving said third arm actuator is a second fluid piston and there is a first adjustable stop mounted on said first carriage for limiting the motion of said first arm actuator with respect to said carriage and there is a second adjustable stop mounted on said second carriage for limiting the motion of said third arm actuator with respect to said second carriage.

24. The positioning system of claim 23 wherein there is a first sensor mounted on said first carriage for sensing when said first pair of fingers is fully closed to indicate non-grasp of a component and there is a second sensor mounted on said second carriage to be actuated by one of said arm actuators on said second carriage for signaling closing of said second pair of fingers to indicate non-grasp of a part by said second pair of fingers.

25. The positioning system of claim 24 further including in combination a positioning robot having said gripper device attached thereto for gripping components.

26. The positioning system of claim 9 further including in combination a positioning robot having said gripper device attached thereto for gripping components.

* * * * *